United States Patent
Shirai et al.

(10) Patent No.: US 9,778,981 B2
(45) Date of Patent: Oct. 3, 2017

(54) MICROCONTROLLER

(71) Applicant: DENSO CORPORATION, Kariya, Aichi-pref. (JP)

(72) Inventors: Hironori Shirai, Kariya (JP); Takaomi Kajikawa, Kariya (JP)

(73) Assignee: DENSO CORPORATION, Kariya (JP)

(*) Notice: Subject to any disclaimer, the term of this patent is extended or adjusted under 35 U.S.C. 154(b) by 2 days.

(21) Appl. No.: 14/962,105

(22) Filed: Dec. 8, 2015

(65) Prior Publication Data

US 2016/0162358 A1 Jun. 9, 2016

(30) Foreign Application Priority Data

Dec. 9, 2014 (JP) ................. 2014-249148

(51) Int. Cl.
*G06F 11/10* (2006.01)
*G11C 29/04* (2006.01)

(52) U.S. Cl.
CPC .. *G06F 11/1048* (2013.01); *G11C 2029/0411* (2013.01)

(58) Field of Classification Search
CPC .................................. G06F 11/1076
USPC ................... 714/764, 48, 23, 38.1
See application file for complete search history.

(56) References Cited

U.S. PATENT DOCUMENTS

| 6,122,574 A * | 9/2000 | Ohtsu ................. G06F 11/0757 701/29.2 |
| 2007/0088974 A1* | 4/2007 | Chandwani ......... G06F 11/0781 714/6.11 |
| 2012/0256753 A1* | 10/2012 | Berland ................. H01H 83/04 340/638 |
| 2015/0130477 A1* | 5/2015 | Berland ............ G01R 31/3277 324/550 |

FOREIGN PATENT DOCUMENTS

| JP | 60-215251 A | 10/1985 |
| JP | 2013-054414 A | 3/2013 |
| JP | 2014-035729 A | 2/2014 |

* cited by examiner

*Primary Examiner* — Fritz Alphonse
(74) *Attorney, Agent, or Firm* — Posz Law Group, PLC

(57) ABSTRACT

A microcontroller includes a nonvolatile memory. The microcontroller executes an ECC error detection to detect an ECC error during a main process, which accesses the nonvolatile memory, and an interrupt process when the ECC error occurs. The interrupt process executes a change process that specifies an instruction causing the ECC error, which is detected by the ECC error detection, and changes a program counter to skip the specified instruction and to execute a next instruction. The microcontroller executes an abnormality value storage process that stores an abnormality value in a storage destination of a read value, and the read value is read in the main process after the change process.

7 Claims, 5 Drawing Sheets

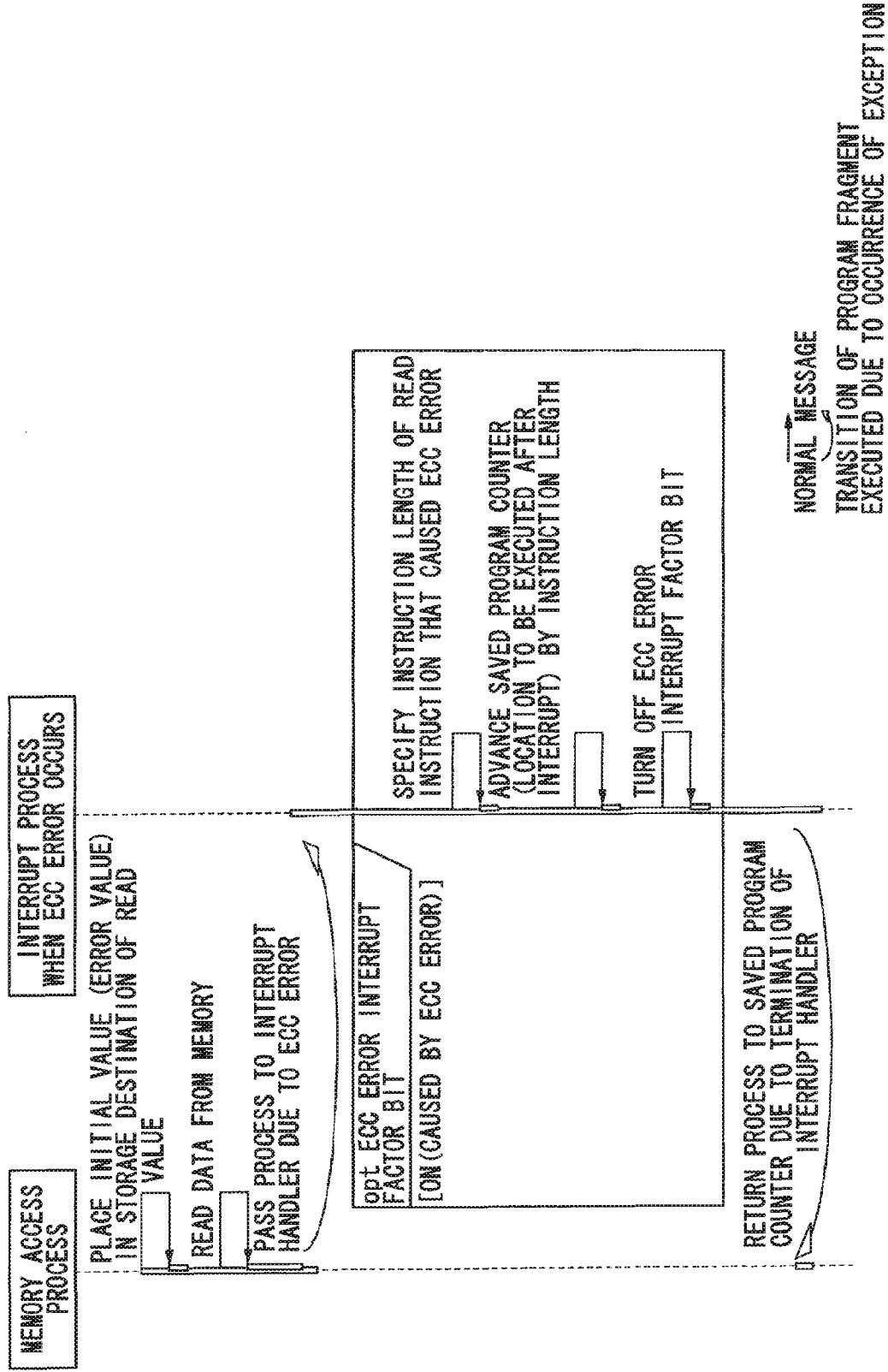

MICROCONTROLLER

CROSS REFERENCE TO RELATED APPLICATION

This application is based on Japanese Patent Application No. 2014-249148 filed on Dec. 9, 2014, the disclosure of which is incorporated herein by reference.

TECHNICAL FIELD

The present disclosure relates to a microcontroller that enables to be used in a controller for a vehicle.

BACKGROUND ART

Patent literature 1: JP 2014-35729 A

Patent literature 1 describes a microcontroller that can be used as a controller for a vehicle. The microcontroller includes a CPU, a nonvolatile memory, and a volatile memory. The nonvolatile memory provides a memory module with a bit error detection function. The memory module includes an error correcting code (ECC) as a redundant data and is capable of both of error detection and error correction on an error of a single bit. However, on an error of two bits or more, the memory module is capable of error detection but is incapable of error correction. Hereinafter, to detect the uncorrectable error is referred to as an ECC error. The uncorrectable error may be the error of two bits or more, for example.

The inventors of the present application have found the following.

In many cases, the nonvolatile memory stores data that needs to be maintained for a long period of time. The ECC error in the data may be considered as a critical hardware error. When the ECC error occurs, a reset in an interrupt handler or erasure in the nonvolatile memory may be performed in general. When the ECC error occurs, the microcontroller cannot continue data process.

A cause of ECC error occurrence includes a nonvolatile memory failure and an access to an incomplete data area resulting from a power-off event that may occur while data is written to or erased from the nonvolatile memory. A key manipulation in a vehicle turns off a power supply when the microcontroller is used as a vehicle ECU. In this case, a user enables to operate the key manipulation arbitrary. The power-off event may occur while data is written to or erased from the nonvolatile memory. A conventional microcontroller performs a reset operation in response to the power-off event and cannot continue operation. Thus, the conventional microcontroller may be inappropriate to be used as an ECU mounted on vehicles.

SUMMARY

It is an object of the present disclosure to provide a microcontroller enabling to continue operation despite an ECC error occurrence and to read data from a location except where an ECC error occurred.

According to one example of the present disclosure, a microcontroller including a nonvolatile memory is provided. The microcontroller executes an ECC error detection to detect an ECC error during a main process, which accesses the nonvolatile memory, and an interrupt process when the ECC error occurs. The interrupt process executes a change process that specifies an instruction causing the ECC error, which is detected by the ECC error detection, and changes a program counter to skip the specified instruction and to execute a next instruction. The microcontroller executes an abnormality value storage process that stores an abnormality value in a storage destination of a read value, so that the read value is read in the main process after the change process.

According to another example of the present disclosure, a microcontroller including a nonvolatile memory and a processor is provided. The processor includes an ECC error detection section detecting an ECC error during a main process, which accesses the nonvolatile memory, and an interrupt process section executing an interrupt process when the ECC error occurs. The interrupt process section executes a change process that specifies an instruction causing the ECC error, which is detected by the ECC error detection section, and changes a program counter to skip the specified instruction and to execute a next instruction. The processor executes an abnormality value storage process that stores an abnormality value in a storage destination of a read value, so that the read value is read in the main process after the change process.

According to the present disclosure, the change process is performed during the interrupt process when an ECC error occurs while the main process is performed. It may be possible to perform the next instruction by skipping the instruction that caused the ECC error to occur. It may be possible to ensure that the operation is continued. An abnormality value is stored in the read value storage destination. It may be possible to read the abnormality value even when an ECC error occurs. Therefore, it may be possible to normally read data from a location other than the location where the ECC error occurred.

According to the present disclosure, it may be possible to provide a microcontroller capable of continuing operation despite an ECC error occurrence and reading data from locations except where an ECC error occurred.

BRIEF DESCRIPTION OF DRAWINGS

The above and other objects, features and advantages of the present disclosure will become more apparent from the following detailed description made with reference to the accompanying drawings. In the drawings:

FIG. 5 is a sequence chart corresponding to FIG. 4.

DETAILED DESCRIPTION

Figure 1:
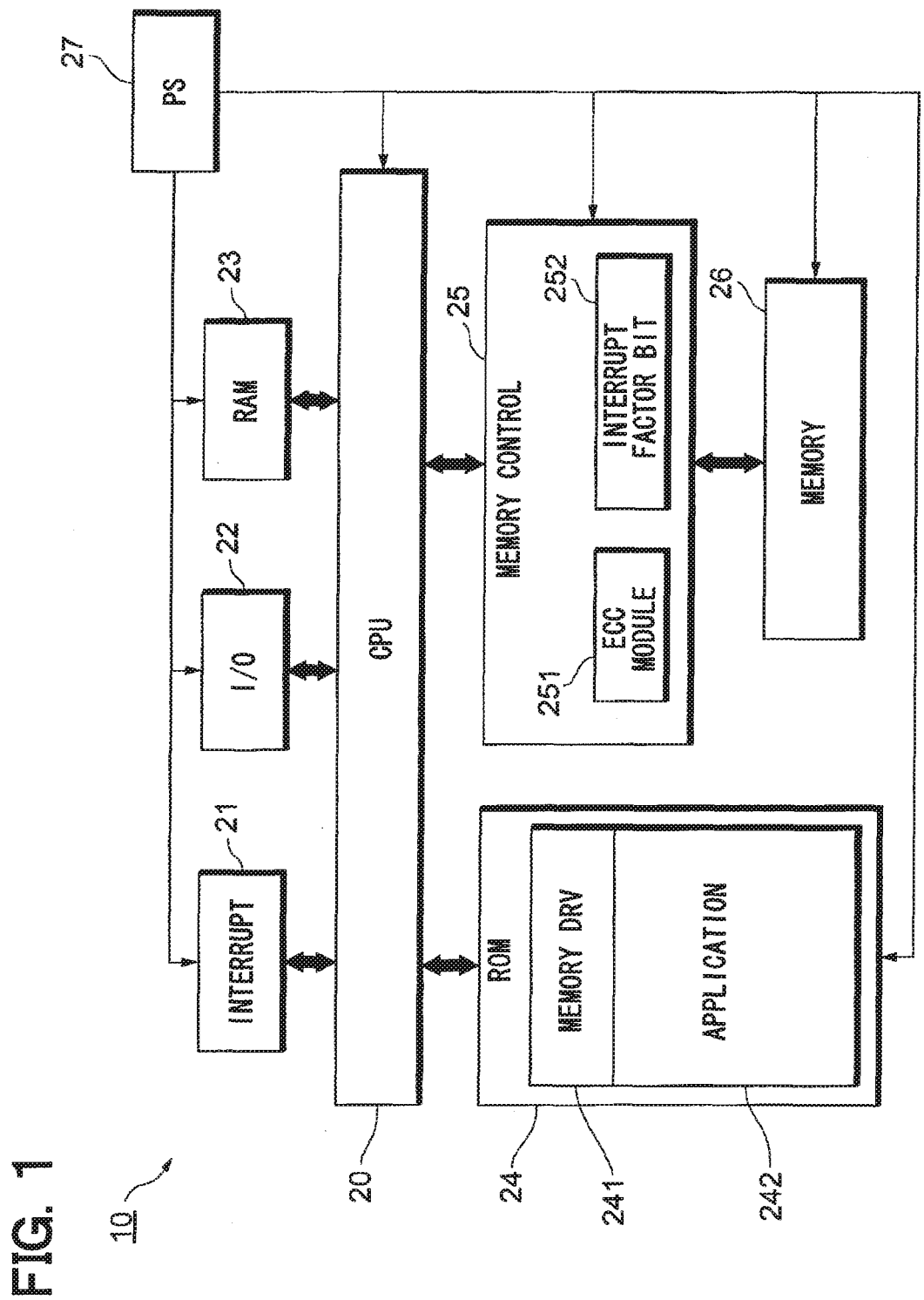
FIG. 1 is a block diagram illustrating a functional configuration of a microcontroller according to an embodiment.

Embodiments of the present disclosure will be described with reference to the drawings. The identical components in the drawings are depicted by the identical reference numerals as much as possible, and a redundant description is omitted for simplicity.

A microcontroller according to an embodiment of the present disclosure will be explained with reference to FIG. 1. As illustrated in FIG. 1, a microcontroller 10 includes a CPU 20, an interrupt controller 21, an I/O port 22, RAM 23, ROM 24, a nonvolatile memory controller 25, a nonvolatile memory 26, and a power supply 27.

The power supply 27 supplies power to operate the CPU 20, the interrupt controller 21, the I/O port 22, the RAM 23, the ROM 24, the nonvolatile memory controller 25, and the nonvolatile memory 26. The CPU 20 outputs a drive signal to the Interrupt controller 21, the I/O port 22, the RAM 23, the ROM 24, and the nonvolatile memory controller 25 to operate these components.

The I/O port 22 provides an interface circuit to exchange data with an external portion. The RAM 23 provides a memory capable of writing and reading data.

The ROM 24 provides a memory capable of only reading data. The ROM 24 stores a nonvolatile memory driver software 241 and an application software 242. The CPU 20 reads the nonvolatile memory driver software 241 and the application software 242 to perform operations, which are described later.

The nonvolatile memory controller 25 writes data to the nonvolatile memory 26, erases data from the nonvolatile memory 26, and reads data from the nonvolatile memory 26. The nonvolatile memory controller 25 includes an ECC module 251 and an interrupt factor bit 252 of the ECC error. The ECC module 251 detects the ECC error. When the ECC error occurs, the nonvolatile memory controller 25 turns on the interrupt factor bit 252 of the ECC error. The ECC module 251 may correspond to an example of an ECC error detection section.

Figure 2:
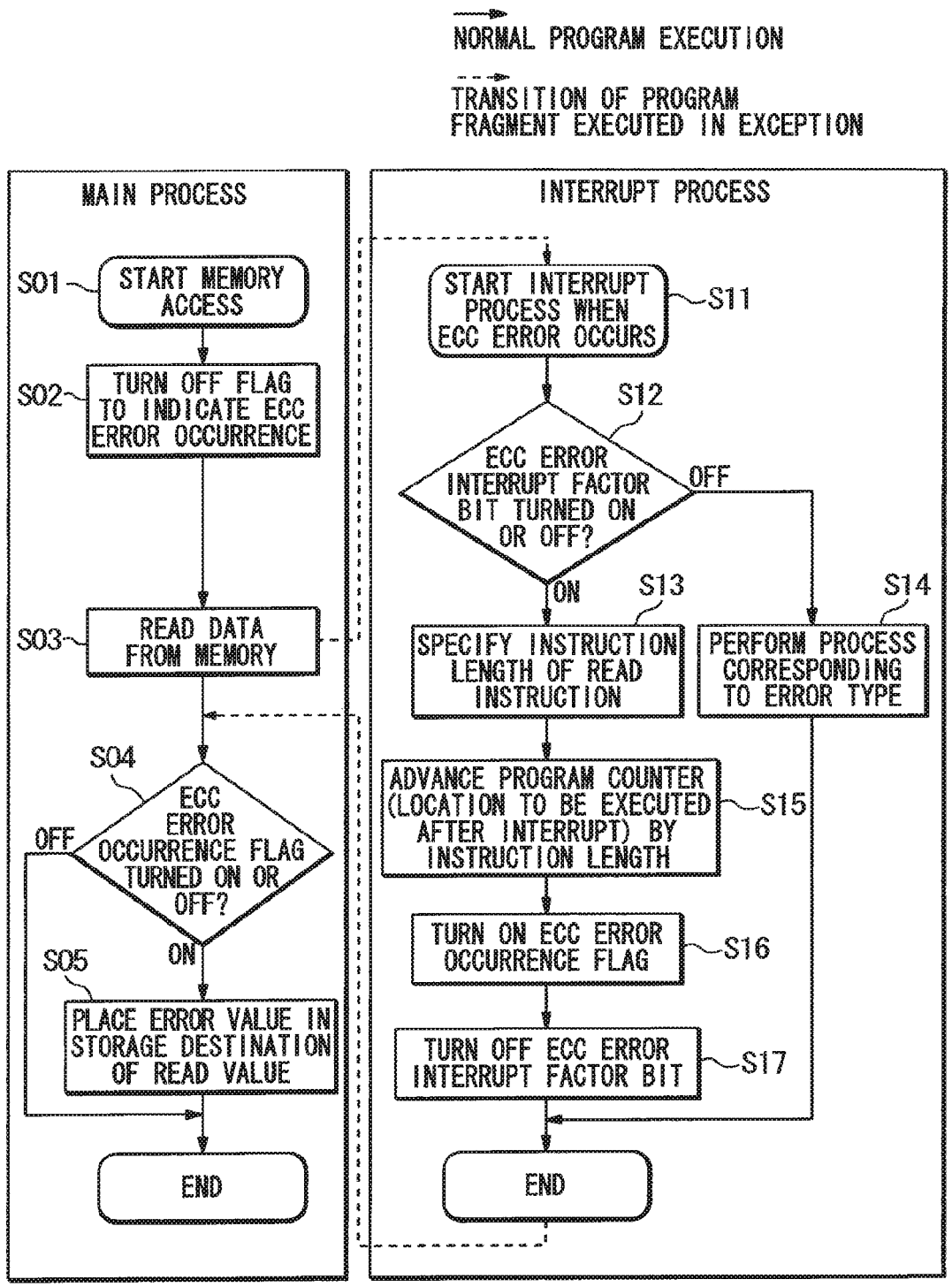
FIG. 2 is a flowchart illustrating an example of an operation of the microcontroller.
Figure 3:
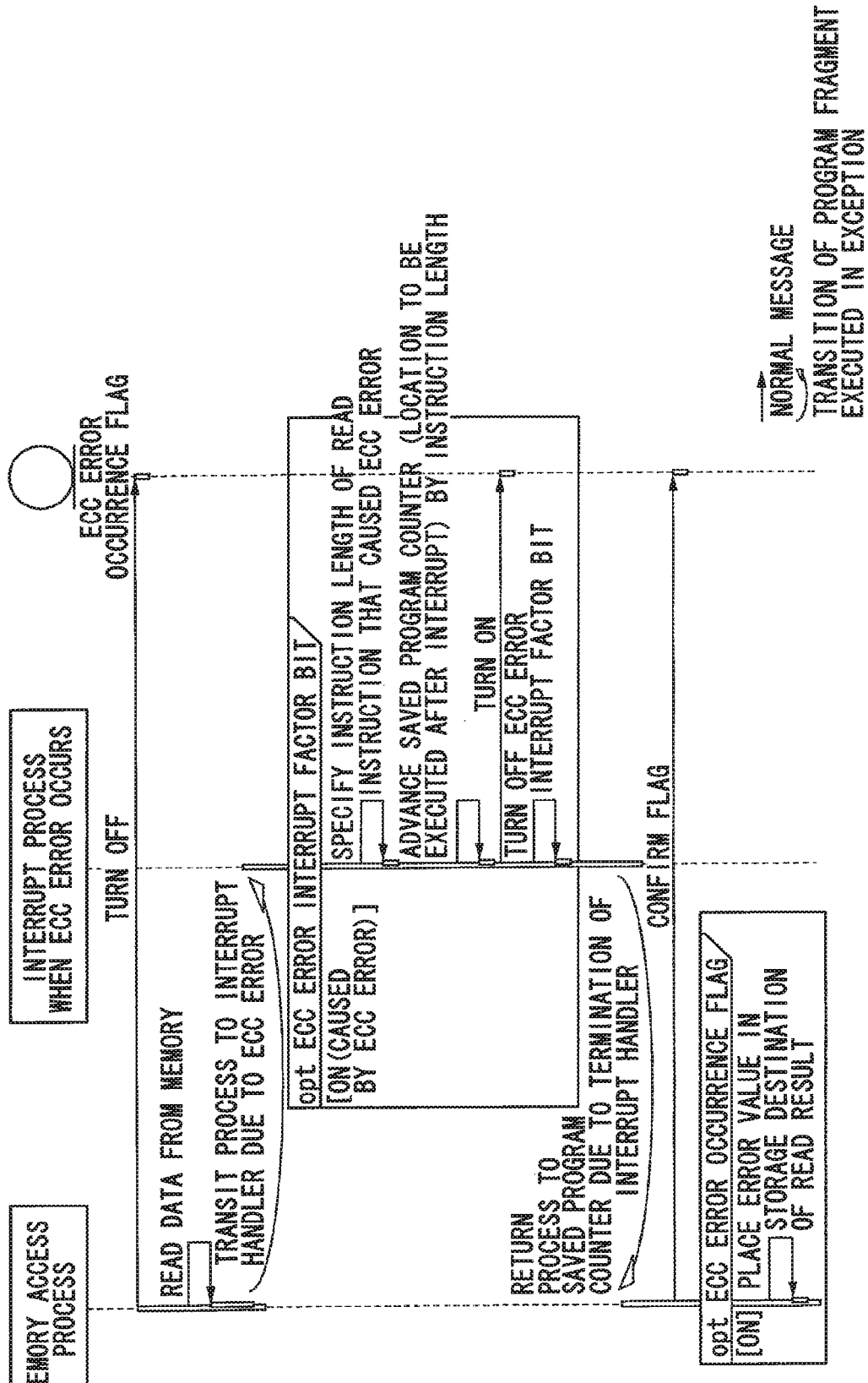
FIG. 3 is a sequence chart corresponding to FIG. 2.

The operation of the microcontroller 10 will be explained with reference to FIG. 2 and FIG. 3. As illustrated in FIG. 2, the microcontroller 10 starts a main process to access data stored in the nonvolatile memory 26 (S01).

At S02, the microcontroller 10 turns off a flag that indicates the presence or absence of the ECC error occurrence. Since the flag is used for determining the ECC error occurrence, it is possible to identify a difference from the ECC error occurring in another concurrently performed process and to reliably perform an interrupt process.

At S03, the microcontroller 10 reads data from the nonvolatile memory 26. When the read process is successful, the microcontroller 10 proceeds to S04. When, in the read process, the ECC error occurs, an execution of an interrupt process is started (S11). In this case, when the interrupt occurs, the microcontroller 10 saves a program counter value corresponding to the interrupt occurrence. Since the interrupt occurred during the execution of a read instruction, the program counter remains indicating the read instruction.

At S12, the microcontroller 10 determines whether the Interrupt factor bit of the ECC error is turned on or off. When the interrupt factor bit of the ECC error is turned on, the microcontroller 10 proceeds to S13. When the interrupt factor bit of the ECC error is turned off, the microcontroller 10 proceeds to S14.

At S14, the microcontroller 10 performs a process corresponding to an error type since the error occurred is not the ECC error. The microcontroller 10 terminates the interrupt process and returns to S04.

At S13, the microcontroller 10 specifies an instruction length of the read instruction that caused the ECC error. At S15 subsequent to S13, the microcontroller 10 advances the saved program counter by the instruction length of the read instruction. Therefore, it is possible that, after the interrupt terminates, the microcontroller 10 performs a program from where the read instruction was skipped (from the next instruction).

At S16, the microcontroller 10 turns on an ECC error occurrence flag. At S17, the microcontroller 10 turns off the Interrupt factor bit of the ECC error.

A process of the microcontroller 10 returns to the main process. At S04, the microcontroller 10 confirms the ECC error occurrence flag. When the ECC error occurrence flag is turned on, the microcontroller 10 proceeds to S05. When the ECC error occurrence flag is turned off, the microcontroller 10 terminates the process. At S05, the microcontroller 10 places an abnormality value (also referred to as an error value) in a read value storage destination and terminates the process.

As described above, during the interrupt process, the microcontroller 10 specifies an instruction that caused the ECC error to occur and executes a change process that changes the program counter so as to skip the specified instruction and return to the main process. It may be possible that the microcontroller 10 continues the process. When no measure is taken, the read process restarts while an incomplete area remains unsolved. The Interrupt process is resumed to fall into an Infinite loop.

When a process returns to the main process after the change process, an abnormality value storage process is activated to perform an ECC error determination that determines whether the ECC error occurred. When determining that the ECC error occurred, the abnormality value storage process stores the abnormality value in the storage destination. Thus, it may be possible to avoid an adverse effect that the read value is undetermined. As a conventional technology, an overall system may be checked at startup and an incomplete area may be recovered. However, such a technology may cause a high load and long time at startup. Thus, such a technology may be inappropriate for a system that needs to start promptly. The embodiment ensures fast activation by storing the abnormality value in the storage destination.

Incidentally, the microcontroller 10 just needs to perform the abnormality value storage process to store the abnormality value in the read value storage destination so that the main process after the change process reads the read value. The above mentioned method is provided as an example.

Figure 4:
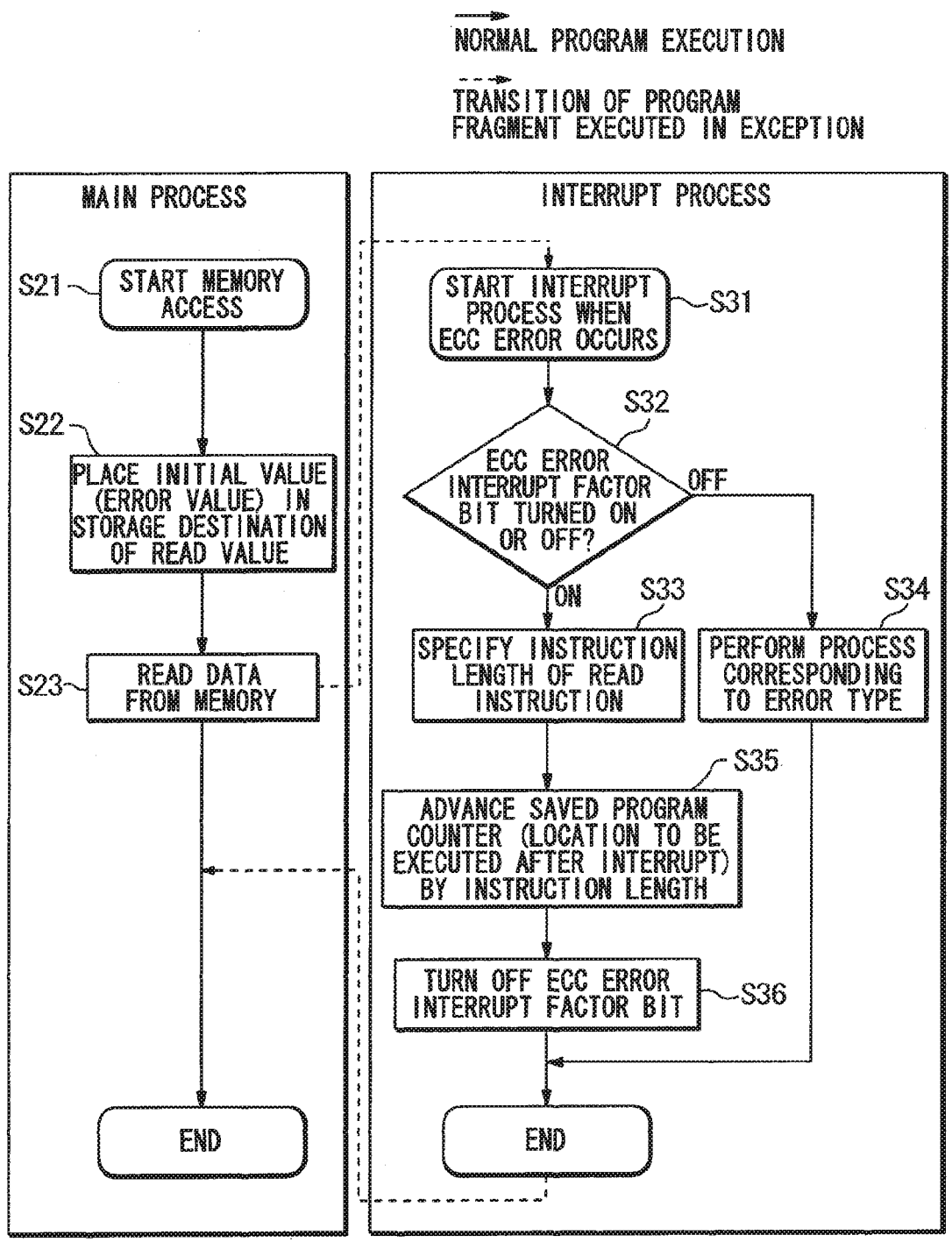
FIG. 4 is a flowchart illustrating another example of an operation of the microcontroller in FIG. 1.

With reference to FIG. 4 and FIG. 5, a method of storing an initial value as the abnormality value in the read value storage destination will be explained. As illustrated in FIG. 4, the microcontroller 10 performs the main process to start accessing data stored in the nonvolatile memory 26 (S21).

At S22, the microcontroller 10 assumes the initial value as an abnormality value and stores the initial value in the read value storage destination. The initial value stored remains stored as the abnormality value when the microcontroller 10 does not read data from the nonvolatile memory 26.

At S23, the microcontroller 10 reads data from the nonvolatile memory 26. When this read process is successful, the microcontroller 10 terminates the main process. When the ECC error occurs in the read process, the microcontroller 10 starts the interrupt process (S31). The microcontroller 10 saves a program counter value corresponding to the interrupt occurrence. Incidentally, the Interrupt occurs during execution of a read instruction, the program counter remains indicating the read instruction.

At S32, the microcontroller 10 determines whether the interrupt factor bit of the ECC error is turned on or turned off. When the interrupt factor bit of the ECC error is turned on, the microcontroller 10 proceeds to S33. When the interrupt factor bit of the ECC error is turned off, the microcontroller 10 proceeds to S34.

At S34, the microcontroller 10 performs a process corresponding to an error type to terminate the interrupt process, since the error occurred is not the ECC error. The microcontroller 10 also terminates the main process.

At S33, the microcontroller 10 specifies an instruction length of the read instruction that caused the ECC error. At S35 subsequent to S33, the microcontroller 10 advances the saved program counter by the instruction length of the read instruction. Thus, it may be possible that the microcontroller 10 performs a program from where the read instruction was skipped (from the next instruction) after the interrupt terminates.

At S36, the microcontroller 10 turns off the interrupt factor bit of the ECC error, terminates the interrupt process, and also terminates the main process.

The microcontroller 10 solves the ECC error occurrence without using the ECC error occurrence flag. It may be possible to enhance performance of the microcontroller 10. When the program is written in C language, however, a compiler optimization may delete the initial value stored at S22. To solve this, a related fragment may be written in an assembly language, however, degrading maintainability compared to the C language. To prevent the maintainability from being degraded, a function may be used to represent a location of the nonvolatile memory to be accessed and confine the fragment that needs to be written in the assembly language. However, this may remarkably degrade the performance and may be impractical when the main process is repeated many times. By contrast, the method described with reference to FIG. 2 and FIG. 3 is free from this issue and excels in the maintainability and the performance.

Incidentally, the abnormality value may be the following value, for example. It is supposed that there is a failsafe process executed in a case a read value is unusual in a certain process that the certain process uses the read value and is executed after accessing of a non-volatile memory. The abnormality value may be a predetermined value that determines whether the failsafe process, which is executed in a case the read value is unusual, is executed or not.

The process from S11 to S17 and the process from S31 to S36 may correspond to an example of an interrupt process section. The process including S13 and S15 and the process including S33 and S35 may correspond to an example of a change process. The process including S04 and S05 and the process including S22 may correspond to an example of an abnormality value storage process. The CPU 20 may correspond to an example of a processor. It should be noticed that any components or any combination of components in the microcontroller, including the CPU 20, the interrupt controller 21, the ROM 24 and the nonvolatile memory controller 25, may correspond to the processor as long as the main process and the Interrupt process are performed.

While the microcontroller according to the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A microcontroller comprising:
a nonvolatile memory;
wherein:
the microcontroller executes
an ECC error detection to detect an ECC error during a main process, which accesses the nonvolatile memory, and
an interrupt process when the ECC error occurs;
the interrupt process executes a change process that specifies an instruction causing the ECC error detected by the ECC error detection, and changes a program counter to skip the specified instruction and to execute a next instruction; and
the microcontroller stores an abnormality value to a storage destination of a read value, the read value being read out in the main process after the change process.

2. The microcontroller according to claim 1, wherein:
the abnormality value storage process executes an ECC error determination to determine whether the ECC error occurred when a process returns to the main process after the change process, and
the abnormality value storage process stores the abnormality value in the storage destination when determining that the ECC error occurred.

3. The microcontroller according to claim 1, wherein:
the abnormality value storage process stores an initial value as the abnormality value in the storage destination before the read value is read from the storage destination and a process returns to the main process after the change process.

4. The microcontroller according to claim 2, wherein:
the ECC error is defined as a detection of an uncorrectable error in a memory module.

5. A microcontroller comprising:
a nonvolatile memory; and
a processor,
wherein:
the processor includes
an ECC error detection section detecting an ECC error during a main process, which accesses the nonvolatile memory, and
an interrupt process section executing an interrupt process when the ECC error occurs;
the interrupt process section executes a change process that specifies an instruction causing the ECC error detected by the ECC error detection section, and changes a program counter to skip the specified instruction and to execute a next instruction; and
the processor stores an abnormality value to a storage destination of a read value, the read value being read out in the main process after the change process.

6. The microcontroller according to claim 5, wherein:
the abnormality value storage process executes an ECC error determination to determine whether the ECC error occurred when a process returns to the main process after the change process, and
the abnormality value storage process stores the abnormality value in the storage destination when determining that the ECC error occurred.

7. The microcontroller according to claim 5, wherein:
the abnormality value storage process stores an initial value as the abnormality value in the storage destination before the read value is read from the storage destination and a process returns to the main process after the change process.

* * * * *